United States Patent
Kyono et al.

(10) Patent No.: US 9,123,843 B2
(45) Date of Patent: Sep. 1, 2015

(54) SEMICONDUCTOR DEVICE

(71) Applicant: Sumitomo Electric Industries, Ltd., Osaka-shi (JP)

(72) Inventors: Takashi Kyono, Itami (JP); Katsushi Akita, Itami (JP); Kaoru Shibata, Itami (JP); Koji Nishizuka, Itami (JP); Kei Fujii, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/492,965

(22) Filed: Sep. 22, 2014

(65) Prior Publication Data

US 2015/0115222 A1    Apr. 30, 2015

(30) Foreign Application Priority Data

Oct. 25, 2013 (JP) .................... 2013-222164

(51) Int. Cl.
| | |
|---|---|
| H01L 21/00 | (2006.01) |
| H01L 31/0352 | (2006.01) |
| H01L 31/0304 | (2006.01) |
| H01L 31/09 | (2006.01) |

(52) U.S. Cl.
CPC .... *H01L 31/035236* (2013.01); *H01L 31/0304* (2013.01); *H01L 31/09* (2013.01)

(58) Field of Classification Search
CPC ............ B82Y 20/20; H01L 31/035236; H01L 31/0352; H01L 31/03046
USPC ................................. 257/14, 18, 21
See application file for complete search history.

(56) References Cited

U.S. PATENT DOCUMENTS

| 5,023,685 A | 6/1991 | Bethea et al. |
| 8,217,480 B2 * | 7/2012 | Ting et al. ............. 257/431 |
| 2002/0105010 A1 | 8/2002 | Ono |
| 2007/0264835 A1 | 11/2007 | Iguchi et al. |

(Continued)

FOREIGN PATENT DOCUMENTS

| JP | 07-162025 A | 6/1995 |
| JP | 11-191633 A | 7/1999 |

(Continued)

OTHER PUBLICATIONS

Rodriguez et al., "A type-II superlattice period with a modified InAs to GaSb thickness ratio for midwavelength infrared photodiode performance improvement," Applied Physics Letters, vol. 97, pp. 251113-1-251113-3 (2010).

(Continued)

*Primary Examiner* — Quoc Hoang
(74) *Attorney, Agent, or Firm* — Venable LLP; Michael A. Sartori; Trent B. Ostler

(57) ABSTRACT

A semiconductor device includes a semiconductor layer laminate in which a plurality of semiconductor layers are laminated, the semiconductor layer laminate including a light receiving layer, the light receiving layer being grown by a metal-organic vapor phase epitaxy method, the light receiving layer having a cutoff wavelength of more than or equal to 3 μm and less than or equal to 8 μm, the semiconductor device having a dark current density of less than or equal to $1 \times 10^{-1}$ A/cm² when a reverse bias voltage of 60 mV is applied at a temperature of $-140°$ C. Thereby, a semiconductor device which can receive light in a mid-infrared range and has a low dark current is provided.

10 Claims, 2 Drawing Sheets

(56) References Cited

U.S. PATENT DOCUMENTS

| | | |
|---|---|---|
| 2011/0101306 A1 | 5/2011 | Akita et al. |
| 2012/0326122 A1 | 12/2012 | Fujii et al. |
| 2013/0248821 A1 | 9/2013 | Miura et al. |
| 2014/0054545 A1 | 2/2014 | Akita et al. |

FOREIGN PATENT DOCUMENTS

| | | |
|---|---|---|
| JP | 2002-231992 A | 8/2002 |
| JP | 2007-324572 A | 12/2007 |
| JP | 2011-100770 A | 5/2011 |
| JP | 2012-009777 A | 1/2012 |
| JP | 2012-094761 A | 5/2012 |
| JP | 2012-114464 A | 6/2012 |
| JP | 2012-119567 A | 6/2012 |
| JP | 2012-191130 A | 10/2012 |
| JP | 2012-256826 A | 12/2012 |
| JP | 2013-093385 A | 5/2013 |
| JP | 2013-201219 A | 10/2013 |
| WO | WO-2012/046676 A1 | 4/2012 |
| WO | WO-2013/065639 A1 | 5/2013 |

OTHER PUBLICATIONS

Katayama, "Development of Type II Superlattice Infrared Detector at JAXA," Optronics, No. 5, pp. 102-105 (2012).

Notice of Grounds of Rejection in Japanese Patent Application No. 2013-222164 dated Jun. 23, 2015.

* cited by examiner

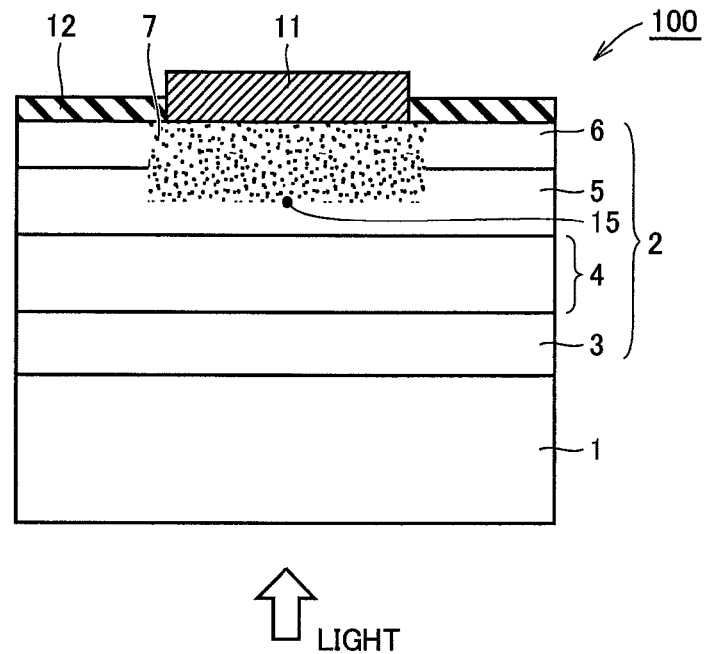
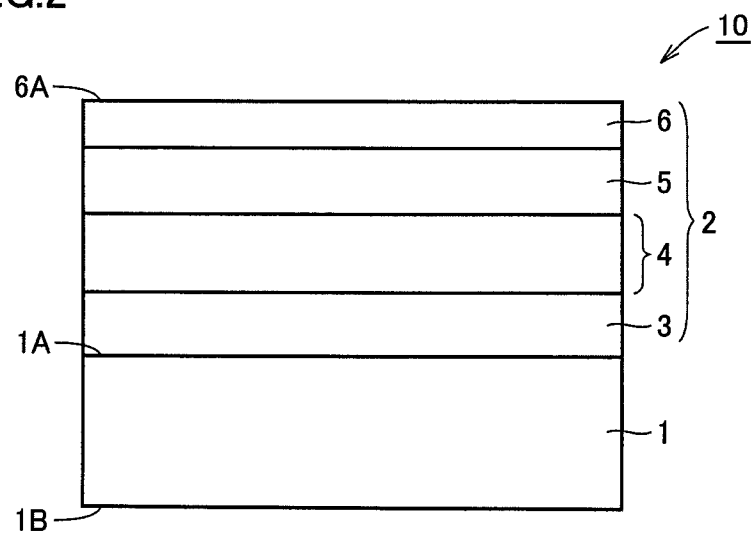

_US 9,123,843 B2_

SEMICONDUCTOR DEVICE

BACKGROUND OF THE INVENTION

1. Field of the Invention

The present invention relates to a semiconductor device, and in particular to a semiconductor device capable of receiving light in a mid-infrared range.

2. Description of the Background Art

For light receiving devices (semiconductor devices) intended for a mid-infrared range, for example, an InAs/GaSb type II multiple quantum well structure formed by laminating a plurality of laminates, each including indium arsenide (InAs) and gallium antimonide (GaSb) as one period, has been known ("A type 11 superlattice period with a modified InAs to GaSb thickness ratio for midwavelength infrared photodiode performance improvement" by J. B. Rodriguez, C. Cervera, and P. Christol, and "Development of Type II Superlattice Infrared Detector at JAXA" by Haruyoshi Katayama, OPTRONICS, (2012) No. 5, pp. 102 to 105).

Further, a light receiving device (semiconductor device) intended for the mid-infrared range has a high dark current value. Therefore, generally, the operating temperature for the light receiving device intended for the mid-infrared range is set low, and such a light receiving device is used together with a cooling apparatus.

SUMMARY OF THE INVENTION

However, it has been confirmed that, even when the light receiving device (semiconductor device) intended for the mid-infrared range is used in a low temperature region at less than or equal to $-140°$ C., it has a dark current value higher than an ideal value.

"A type II superlattice period with a modified InAs to GaSb thickness ratio for midwavelength infrared photodiode performance improvement" by J. B. Rodriguez, C. Cervera, and P. Christol, and "Development of Type II Superlattice Infrared Detector at JAXA" by Haruyoshi Katayama, OPTRONICS, (2012) No. 5, pp. 102 to 105 describe that, in an InAs/GaSb Type II multiple quantum well structure formed by a molecular beam epitaxy (MBE) method, the dark current exhibits a value higher than an ideal value in the low temperature region at less than or equal to $-140°$ C.

Concerning this phenomenon, "A type II superlattice period with a modified InAs to GaSb thickness ratio for midwavelength infrared photodiode performance improvement" by J. B. Rodriguez, C. Cervera, and P. Christol describes that a diffusion current is dominant in the dark current in a high temperature region at about a room temperature, whereas a generation current is dominant in the dark current in the low temperature region at less than or equal to $-140°$ C.

The present invention has been made to solve the aforementioned problem. A main object of the present invention is to provide a semiconductor device which can receive light in a mid-infrared range and has a low dark current.

A semiconductor device in accordance with the present invention includes a semiconductor layer laminate in which a plurality of semiconductor layers are laminated, the semiconductor layer laminate including a light receiving layer, the light receiving layer being grown by a metal-organic vapor phase epitaxy method, the light receiving layer having a cutoff wavelength of more than or equal to 3 µm and less than or equal to 8 µm, the semiconductor device having a dark current density of less than or equal to $1\times10^{-1}$ A/cm$^2$ when a reverse bias voltage of 60 mV is applied at a temperature of $-140°$ C.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross sectional view of a semiconductor device in accordance with the present embodiment.

FIG. 2 is a cross sectional view of an epitaxial substrate in which the semiconductor device in accordance with the present embodiment is formed.

DESCRIPTION OF THE PREFERRED EMBODIMENTS

Figure 3:
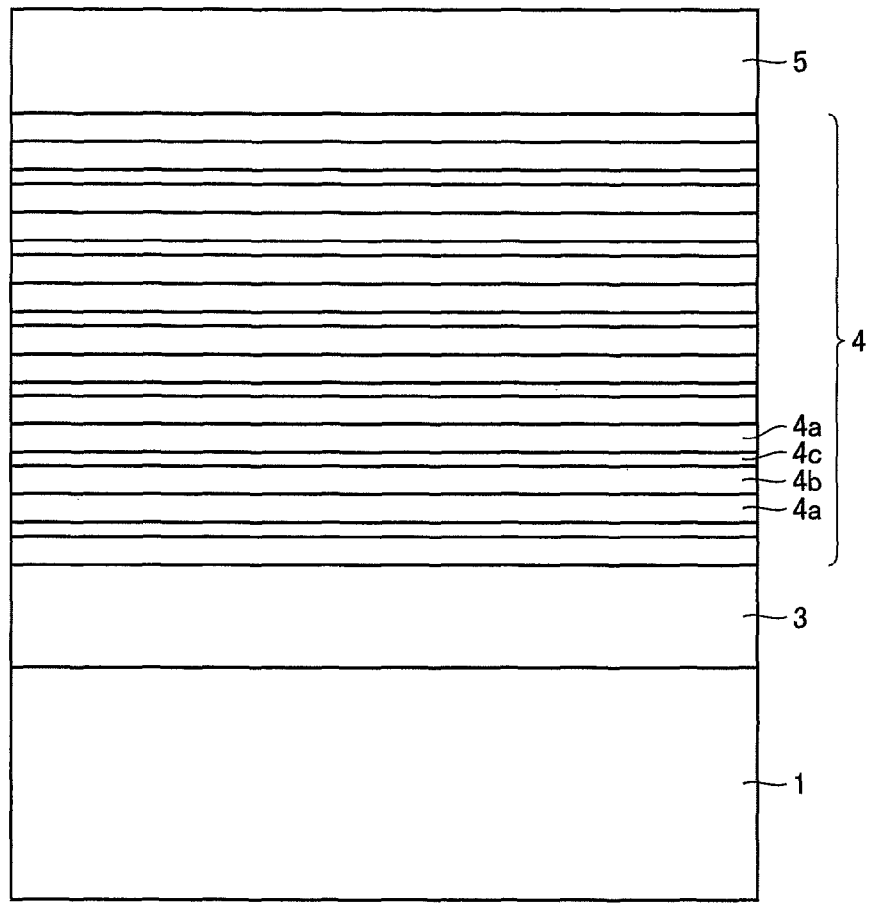
FIG. 3 is a cross sectional view for illustrating a light receiving layer of the semiconductor device in accordance with the present embodiment.

Hereinafter, an embodiment of the present invention will be described with reference to the drawings. It is noted that, in the drawings described below, identical or corresponding parts will be designated by the same reference numerals, and the description thereof will not be repeated.

Description of Embodiment of Invention of Present Application

First, an overview of the embodiment of the present invention will be listed.

(1) A semiconductor device 100 in accordance with one aspect in the present embodiment includes a semiconductor layer laminate 2 in which a plurality of semiconductor layers are laminated, semiconductor layer laminate 2 including a light receiving layer 4, light receiving layer 4 being grown by a metal-organic vapor phase epitaxy method, light receiving layer 4 having a cutoff wavelength of more than or equal to 3 µm and less than or equal to 8 µm, the semiconductor device having a dark current density of less than or equal to $1\times10^{-1}$ A/cm$^2$ when a reverse bias voltage of 60 mV is applied at a temperature of $-140°$ C.

In the metal-organic vapor phase epitaxy method, since its growth temperature is higher than that in an ordinary MBE method, migration of atoms tends to be enhanced in a surface of a base substrate 1 (for example, GaSb substrate), and crystal defects can be reduced. The crystal defects formed within light receiving layer 4 generate carriers via traps when semiconductor device 100 is operated as a light receiving device, causing a dark current. However, in semiconductor device 100 in accordance with the present embodiment, light receiving layer 4 has less crystal defects, and has a trap density (Nt) suppressed low. For example, an impurity concentration within light receiving layer 4 can be reduced, and a carbon concentration within light receiving layer 4 can be suppressed to less than or equal $1\times10^{16}$ cm$^{-3}$. Thus, in semiconductor device 100 in accordance with the present embodiment, a generation current generated within light receiving layer 4 via crystal defects can be reduced, and the dark current can be suppressed low in a low temperature region at less than or equal to $-140°$ C. In addition, since the metal-organic vapor phase epitaxy method is excellent in manufacturing efficiency, it is suitable for mass production.

Here, regarding the method for growing light receiving layer 4, all of source materials for constituent elements may be organic metals (hereinafter referred to as a total organic MOVPE method).

A source material gas made of an organic metal is easily decomposable because it has a high molecular weight. Accordingly, an organic metal source material gas used for the total organic MOVPE method can be supplied to the vicinity of base substrate 1 (for example, GaSb substrate) in a completely decomposed state. As a result, a phenomenon that an undecomposed source material gas, an intermediate product generated in the course of decomposition, and the like are supplied to the vicinity of base substrate 1 (for example, GaSb substrate) and incorporated into a crystal (i.e., a phenomenon confirmed in an ordinary MOVPE method) can be suppressed. Therefore, using the organic metal source material gas is advantageous for reducing the concentration of an impurity such as carbon incorporated into light receiving layer 4.

That is, light receiving layer 4 formed by the total organic MOVPE method has a high crystal quality and less crystal defects. Consequently, the generation current can be reduced, and the dark current can be suppressed low in the low temperature region at less than or equal to −140° C.

Further, light receiving layer 4 is formed using the metal-organic vapor phase epitaxy method to have a cutoff wavelength of more than or equal to 3 μm and less than or equal to 8 μm.

Generally, in semiconductor device 100, irrespective of the type of the light receiving layer, the dark current tends to be increased as an effective bandgap thereof is reduced (that is, as the cutoff wavelength of light receiving layer 4 is increased). In particular, it is known that a diffusion current and a generation current, which are main components of the dark current, are increased as the effective bandgap of the light receiving layer is reduced.

In contrast, in semiconductor device 100 in accordance with the present embodiment, the generation current generated within light receiving layer 4 via crystal defects can be reduced, as described above. Therefore, a dark current density of less than or equal to $1 \times 10^{-1}$ A/cm$^2$ can be achieved when a reverse bias voltage of 60 mV is applied to a p type electrode and an n type electrode 11 with the temperature of semiconductor device 100 being set to −140° C., while setting the cutoff wavelength of light receiving layer 4 to a long wavelength of more than or equal to 3 μm and less than or equal to 8 μm.

That is, by forming light receiving layer 4 using the metal-organic vapor phase epitaxy method, the effective bandgap in light receiving layer 4 can be controlled, and light receiving layer 4 having a high crystal quality and capable of receiving light in the mid-infrared range can be formed. Light receiving layer 4 may have a quantum well structure formed by laminating a plurality of compound semiconductor layers having different bandgaps. When the quantum well structure is adopted, the effective bandgap in light receiving layer 4 can be changed by controlling the combination, film thicknesses, and the like of materials constituting a quantum well, and light receiving layer 4 can have a wide variety of cutoff wavelengths. For example, when a type II quantum well structure is adopted, light receiving layer 4 can receive light having a longer wavelength, because an energy difference between a valence band of one layer and a conduction band of the other layer constituting a quantum well can be set to be smaller than the bandgap of each layer constituting the quantum well structure. On this occasion, a lower dark current can be expected, because an effective mass of carriers in each layer is larger than that in a bulk material corresponding to an equal cutoff wavelength. One period of the quantum well structure may include at least GaSb and InAs. On this occasion, a type II transition occurs between a valence band of GaSb and a conduction band of InAs.

In addition, components of the dark current include a surface leakage current, a tunnel current, and the like. The surface leakage current can be reduced to a sufficiently low level by process technology in manufacturing semiconductor device 100, and the tunnel current can be suppressed to a sufficiently low level unless a large reverse bias is applied to semiconductor device 100.

In this manner, since semiconductor device 100 in accordance with the present embodiment includes light receiving layer 4 formed using the metal-organic vapor phase epitaxy method, semiconductor device 100 can receive light in the mid-infrared range, and can suppress the dark current low in the low temperature region at less than or equal to −140° C.

(2) Semiconductor device 100 in accordance with another aspect in the present embodiment includes semiconductor layer laminate 2 in which a plurality of semiconductor layers are laminated, semiconductor layer laminate 2 including light receiving layer 4, light receiving layer 4 having a cutoff wavelength of more than or equal to 3 μm and less than or equal to 8 μm, the semiconductor device having a dark current density of less than or equal to $1 \times 10^{-4}$ A/cm$^2$ when a reverse bias voltage of 60 mV is applied at a temperature of −140° C.

That is, in semiconductor device 100 in accordance with the other aspect in the present embodiment, light receiving layer 4 having a high crystal quality and less crystal defects can be formed using, for example, the metal-organic vapor phase epitaxy method. Thereby, the generation current can be reduced, and a dark current density of less than or equal to $1 \times 10^{-4}$ A/cm$^2$ can be achieved in the low temperature region at less than or equal to −140° C.

(3) In semiconductor device 100 in accordance with the present embodiment, light receiving layer 4 has a cutoff wavelength of more than or equal to 3 μm and less than or equal to 5 μm, and a dark current density of less than or equal to $5 \times 10^{-5}$ A/cm$^2$ can be achieved when a reverse bias voltage of 60 mV is applied at a temperature of −140° C.

That is, since the generation current generated within light receiving layer 4 can be reduced as described above in semiconductor device 100 in accordance with the present embodiment, a dark current density of less than or equal to $5 \times 10^{-5}$ A/cm$^2$ can be achieved in the low temperature region at less than or equal to −140° C. regarding reception of light of a short wavelength region in the mid-infrared range.

(4) In semiconductor device 100 in accordance with the present embodiment, light receiving layer 4 has a cutoff wavelength of more than or equal to 3 μm and less than or equal to 6 μm, and a dark current density of less than or equal to $1 \times 10^{-8}$ A/cm$^2$ can be achieved when a reverse bias voltage of 60 mV is applied at a temperature of −196° C.

That is, since the generation current generated within light receiving layer 4 can be reduced as described above in semiconductor device 100 in accordance with the present embodiment, a dark current density of less than or equal to $1 \times 10^{-8}$ A/cm$^2$ can be achieved in a low temperature region at less than or equal to −196° C. regarding reception of light of a short wavelength region in the mid-infrared range.

(5) In semiconductor device 100 in accordance with the present embodiment, light receiving layer 4 has a cutoff wavelength of more than or equal to 6 μm and less than or equal to 8 μm, and a dark current density of less than or equal to $1 \times 10^{-5}$ A/cm$^2$ can be achieved when a reverse bias voltage of 60 mV is applied at a temperature of −196° C.

That is, since the generation current generated within light receiving layer 4 can be reduced as described above in semiconductor device 100 in accordance with the present embodiment, a dark current density of less than or equal to $1\times10^{-5}$ A/cm$^2$ can be achieved in the low temperature region at less than or equal to $-196°$ C. regarding reception of light of a long wavelength region in the mid-infrared range.

(6) In semiconductor device 100 in accordance with the present embodiment, light receiving layer 4 may have a multiple quantum well structure. With this structure, a wavelength region of light which can be received by semiconductor device 100 can be set to a wide variety of values, in accordance with the composition, combination, and film thicknesses of materials constituting light receiving layer 4. Thus, by controlling these parameters, light in the mid-infrared range can be received while using materials having larger bandgaps when compared with a case where a light receiving layer is formed using a single material.

(7) In semiconductor device 100 in accordance with the present embodiment, light receiving layer 4 may have a type II multiple quantum well structure, and one period of a multiplex quantum well may include at least GaSb and InAs.

That is, since light receiving layer 4 has a type II multiple quantum well structure in which a transition occurs between the conduction band of InAs and the valence band of GaSb, light receiving layer 4 has a bandgap narrower than the bandgaps of InAs and GaSb. Thus, a low dark current can be expected due to a large effective mass of carriers. In addition, a wide cutoff wavelength of more than or equal to 3 μm and less than or equal to 30 μm can be achieved by controlling the composition and film thicknesses of InAs and GaSb.

The number of periods in the multiple quantum well structure can be set to, for example, more than or equal to 80 and less than or equal to 400. When the number of periods is more than or equal to 80, certain light absorption can be ensured, and sensitivity to mid-infrared light can be obtained. When more than 400 periods are laminated, the total thickness exceeds a film thickness necessary for light reception, and thus sensitivity tends to remain unchanged or to be reduced, which may deteriorate crystallinity and throughput.

(8) In semiconductor device 100 in accordance with the present embodiment, light receiving layer 4 can have a carbon impurity concentration of less than or equal $1\times10^{16}$ cm$^{-3}$.

That is, as light receiving layer 4, light receiving layer 4 having a high crystal quality and less crystal defects can be formed using, for example, the metal-organic vapor phase epitaxy method. In this manner, the concentration of the impurity incorporated into light receiving layer 4 can be reduced and a depletion layer easily spreads, and thus light reception sensitivity of semiconductor device 100 can be improved.

(9) In semiconductor device 100 in accordance with the present embodiment, light receiving layer 4 is grown by the metal-organic vapor phase epitaxy method. Light receiving layer 4 may also be formed by the total organic MOVPE method. Further, semiconductor layer laminate 2 may be grown by the metal-organic vapor phase epitaxy method or the total organic MOVPE method.

By being formed by the total organic MOVPE method, semiconductor layer laminate 2 including light receiving layer 4 has a high crystal quality and less crystal defects as a whole. Accordingly, each layer can play its own role such as light reception or electric conduction at an excellent level, and can improve characteristics of the device. In addition, the total organic MOVPE method has a feature that a group V source material has a decomposition temperature lower than that of a hydride source material used in an ordinary metal-organic vapor phase epitaxy method. Therefore, when semiconductor layer laminate 2 contains Sb, growth temperature can be lowered when compared with the ordinary metal-organic vapor phase epitaxy method, and a semiconductor layer containing Sb, which is less likely to be incorporated at high temperature, can be grown with a good crystallinity.

Details of Embodiment of Invention of Present Application

Next, details of the embodiment of the present invention will be described.

Embodiment 1

Referring to FIGS. 1 to 3, semiconductor device 100 in accordance with Embodiment 1 will be described. Semiconductor device 100 in accordance with the present embodiment is a planar-type light receiving device, and includes base substrate 1 and semiconductor layer laminate 2 formed on a first main surface 1A of base substrate 1.

Base substrate 1 can be made of gallium antimonide (GaSb). Base substrate 1 has first main surface 1A made of a (001) plane, and a second main surface 1B located on a side opposite to first main surface 1A. Base substrate 1 may have p type conductivity, in a state not doped intentionally or in a state doped with an impurity such as Zn. On this occasion, a p type electrode can be formed on second main surface 1B of base substrate 1.

Semiconductor layer laminate 2 is composed by laminating a buffer layer 3, light receiving layer 4, a diffusion concentration distribution adjustment layer 5, and a contact layer 6 in order on first main surface 1A of base substrate 1. Semiconductor layer laminate 2 is grown by the total organic MOVPE method.

Buffer layer 3 is made of GaSb, as with base substrate 1. Light receiving layer 4 is formed above first main surface 1A with buffer layer 3 interposed therebetween, and has a multiple quantum well structure. Specifically, light receiving layer 4 has a type II InAs/GaSb multiple quantum well structure in which approximately 100 pairs of quantum wells, each including a GaSb layer 4a and an InAs layer 4b, are laminated. GaSb layer 4a has a film thickness of, for example, approximately 3 nm, and InAs layer 4b has a film thickness of, for example, approximately 3 nm. On this occasion, light receiving layer 4 has a cutoff wavelength of approximately 5 μm. Both GaSb layer 4a and InAs layer 4b are not doped intentionally. The concentration of Te in light receiving layer 4 is less than or equal to $1\times10^{16}$ cm$^{-3}$, and is preferably less than or equal to a detection limit in secondary ion mass spectrometry (SIMS). When the concentration of Te in light receiving layer 4 is within this range, an increase in the dark current can be suppressed. In addition, since the depletion layer easily spreads, light reception sensitivity of the semiconductor device can be improved. Light receiving layer 4 has a carbon concentration of less than or equal $1\times10^{16}$ cm$^{-3}$. Thereby, the depletion layer easily spreads in light receiving layer 4, and thus light reception sensitivity of semiconductor device 100 can be improved.

Further, in light receiving layer 4, an indium antimonide (InSb) layer 4c with approximately more than or equal to 0.4 monolayers (ML) and less than or equal to 2 ML is preferably formed between pairs of quantum wells. It is only necessary to form InSb layer 4c above GaSb layer 4a and below InAs layer 4b, or form InSb layer 4c above InAs layer 4b and below GaSb layer 4a. InSb layer 4c may also be formed on both the upper and the lower sides of GaSb layer 4a. InSb layer 4c is formed as a strain compensation layer in light receiving layer 4. That is, forming InSb layer 4c between GaSb layer 4a and InAs layer 4b can suppress occurrence of misfit dislocation within light receiving layer 4 due to lattice mismatch between InAs and base substrate 1 or buffer layer 3 made of GaSb. When InSb layer 4c has a film thickness of more than or equal to 0.4 ML, InSb layer 4c can have an effect as a strain compensation layer. When InSb layer 4c has a film thickness of more than 2 ML, the film thickness exceeds a film thickness necessary for strain compensation, and thus dislocation may occur in light receiving layer 4. The strain compensation layer may be made of a ternary mixed crystal such as GaInSb or InAsSb, instead of being made of InSb.

Since GaSb layer 4a, InAs layer 4b, and InSb layer 4c constituting light receiving layer 4 are formed by the total organic MOVPE method, all of these layers have a high crystallinity and less crystal defects.

Diffusion concentration distribution adjustment layer 5 is formed on light receiving layer 4. Diffusion concentration distribution adjustment layer 5 is made of InAs. Diffusion concentration distribution adjustment layer 5 is not doped intentionally. Diffusion concentration distribution adjustment layer 5 may be made of GaSb.

Contact layer 6 is formed on diffusion concentration distribution adjustment layer 5. Contact layer 6 is made of InAs. Contact layer 6 has a third main surface 6A located on a side opposite to second main surface 1B of base substrate 1. Contact layer 6 is not doped intentionally.

At a predetermined region in third main surface 6A, an n type diffusion region 7 is formed. Specifically, n type diffusion regions 7 are formed at a plurality of regions where pixels are arranged as planar-type light receiving devices in semiconductor layer laminate 2. N type diffusion region 7 contains tellurium (Te) as an n type impurity, and is formed by selectively diffusing Te from third main surface 6A.

N type diffusion region 7 is formed to extend from contact layer 6 to the predetermined region in diffusion concentration distribution adjustment layer 5, in a direction perpendicular to third main surface 6A (i.e., in a lamination direction of semiconductor layer laminate 2). That is, a lower end of n type diffusion region 7 in the above direction (i.e., a Te diffusion front) is present within diffusion concentration distribution adjustment layer 5, and is not present within light receiving layer 4. At the lower end of n type diffusion region 7 (Te diffusion front), a pn junction 15 is formed by n type diffusion region 7 and diffusion concentration distribution adjustment layer 5.

N type diffusion region 7 has a distribution of the concentration of Te in the direction perpendicular to third main surface 6A. Specifically, the concentration of Te in n type diffusion region 7 is, for example, more than or equal to $4 \times 10^{16}$ cm$^{-3}$ and less than or equal to $1 \times 10^{21}$ cm$^{-3}$ on diffusion concentration distribution adjustment layer 5, and is provided to be reduced downward from an interface with contact layer 6. Further, the concentration of Te in n type diffusion region 7 is, for example, more than or equal to $1 \times 10^{21}$ cm$^{-3}$ and less than or equal to $3 \times 10^{21}$ cm$^{-3}$ on contact layer 6. In particular, the concentration of Te in n type diffusion region 7 is, for example, more than or equal to $2 \times 10^{21}$ cm$^{-3}$ and less than or equal to $3 \times 10^{21}$ cm$^3$ at a lower portion of contact layer 6 (a first InAs layer 6a) having an interface with diffusion concentration distribution adjustment layer 5, and is, for example, more than or equal to $1 \times 10^{21}$ cm$^{-3}$ and less than or equal to $3 \times 10^{21}$ cm$^{-3}$ at an upper portion of contact layer 6 (a second InAs layer 6b) including third main surface 6A.

A p type electrode (not shown) is formed on second main surface 1B of base substrate 1. In addition, n type electrode 11 is formed on third main surface 6A of contact layer 6, on each of a plurality of n type diffusion regions 7. The p type electrode is in ohmic contact with base substrate 1, and n type electrode 11 is in ohmic contact with n type diffusion region 7 in contact layer 6. It is only necessary that the p type electrode is made of, for example, a Ti/Pt/Au alloy or the like. It is only necessary that n type electrode 11 is made of, for example, Au/Ge/Ni or the like. A passivation film 12 is formed at a region on third main surface 6A in which n type electrode 11 is not formed. Passivation film 12 can be made of, for example, SiO$_2$ or SiN.

Next, a method for manufacturing the semiconductor device in accordance with the present embodiment will be described.

First, base substrate 1 is prepared (step (S10)). Base substrate 1 is a GaSb substrate, and has p type conductivity by being doped with a p type impurity such as zinc (Zn).

Next, base substrate 1 is placed in an MOVPE growth chamber to grow buffer layer 3 (step (S20)). Specifically, buffer layer 3 made of GaSb is formed on base substrate 1. In this step (S20), buffer layer 3 is grown by the total organic MOVPE method. As a source material for Ga, TEGa (triethyl gallium), TMGa (trimethyl gallium), or the like can be used. As a source material for Sb (antimony), TMSb (trimethyl antimony), TESb (triethyl antimony), TIPSb (triisopropyl antimony), TDMASb (tri dimethylamino antimony), TTBSb (tri tertiary butyl antimony), or the like can be used.

Subsequently, light receiving layer 4 is grown (step (S30)). Specifically, an InAs/GaSb multiple quantum well structure including InSb layer 4c is formed by the total organic MOVPE method. That is, in this step (S30), light receiving layer 4 is grown using organic metal gases as source material gases, without using an inorganic metal gas. As a source material for In, TEIn (triethyl indium), TMIn (trimethyl indium), or the like can be used. As a source material for As, TBAs (tertiary butyl arsine), TMAs (trimethyl arsenic), or the like can be used.

Preferably, the growth temperature of the InAs/GaSb multiple quantum well structure is set to more than or equal to 430° C. and less than or equal to 550° C. When the growth temperature is set to more than or equal to 430° C., the source material gases as described above can be efficiently decomposed. In addition, when the growth temperature is set to more than or equal to 430° C., decomposed atoms fully migrate, and thus light receiving layer 4 can be grown with a good crystallinity. On the other hand, when the growth temperature is set to more than 550° C., efficiency of incorporating antimony (Sb) is deteriorated. Further, in a case where the InAs/GaSb multiple quantum well structure includes InSb layer 4c as in the semiconductor device in accordance with the present embodiment, it is desirable to set the growth temperature to less than or equal to 500° C. When the growth temperature is more than 500° C., it is difficult to grow InSb having a low melting point of 527° C. By setting the growth temperature to less than or equal to 500° C., that is, to a temperature sufficiently lower than the melting point of InSb, light receiving layer 4 having InSb layer 4c with a high crystallinity can be formed. As a result, InSb layer 4c can fully exhibit a strain compensation function, and can suppress occurrence of misfit dislocation within light receiving layer 4.

While light receiving layer 4 having the multiple quantum well structure is formed by repeatedly growing InAs layer 4b, GaSb layer 4a, and InSb layer 4c in this step (S30), it is preferable to interrupt growth at predetermined timing.

Specifically, it is preferable to provide a first growth interruption period after InAs layer 4b is grown and before GaSb layer 4a is grown, by stopping supply of a source material gas used to grow InAs layer 4b while continuing evacuation of the growth chamber. After a lapse of the first growth interruption period, growing GaSb layer 4a is started. This can suppress the source material gas containing arsenic (As) used to grow InAs layer 4b from remaining within the growth chamber in the step of growing GaSb layer 4a or InSb layer 4c performed after the step of growing InAs layer 4b, and causing incorporation of As into GaSb layer 4a or InSb layer 4c. Thereby, GaSb layer 4a or InSb layer 4c can be prevented from being subjected to an unintentional strain, and crystal defects in light receiving layer 4 can be reduced. The first growth interruption period is preferably set to, for example, more than or equal to 3 seconds and less than or equal to 25 seconds. When the first growth interruption period is set to more than or equal to 3 seconds, incorporation of As into GaSb layer 4a or InSb layer 4c can be suppressed. When the first growth interruption period is set to less than or equal to 25 seconds, decomposition of As from InAs layer 4b can be suppressed. It is noted that a source material gas containing Sb used to grow GaSb layer 4a may be supplied into the growth chamber in at least a portion of the first growth interruption period. Thereby, incorporation of As into GaSb layer 4a can be suppressed more effectively.

In addition, it is preferable to provide a second growth interruption period after InSb layer 4c is grown and before InAs layer 4b is grown, by stopping supply of a source material gas used to grow InSb layer 4c while continuing evacuation of the growth chamber. On this occasion, it is preferable to pass the source material gas containing As used to grow InAs layer 4b in at least a portion of the second growth interruption period. Here, Sb tends to segregate on a surface or an interface of InSb layer 4c due to a surfactant effect. Thus, it is not indispensable to supply the source material gas containing Sb onto InSb layer 4c in the second growth interruption period for the purpose of protecting the surface or the interface of InSb layer 4c or GaSb layer 4a. On the other hand, by supplying the source material gas containing As in at least a portion of the second growth interruption period, the source material gases can be switched smoothly, and composition can be sharply changed at a junction interface between InSb layer 4c and InAs layer 4b. Thereby, crystallinity of light receiving layer 4 can be enhanced. The second growth interruption period is preferably set to, for example, more than or equal to 3 seconds and less than or equal to 25 seconds. When the second growth interruption period is set to more than or equal to 3 seconds, composition can be sharply changed at the junction interface between InSb layer 4c and InAs layer 4b. In addition, even if the second growth interruption period is set to more than 25 seconds, such an increase in time provides little effect in further improving a sharp change in composition at the junction interface, and accordingly, the second growth interruption period is preferably set to less than or equal to 25 seconds in terms of throughput and the like.

In this manner, light receiving layer 4 having a type II InAs/GaSb multiple quantum well structure in which approximately 100 pairs of quantum wells, each of which is InAs layer 4b/GaSb layer 4a including InSb layer 4c, are laminated is formed.

Next, diffusion concentration distribution adjustment layer 5 is grown (step (S40)). Specifically, diffusion concentration distribution adjustment layer 5 made of InAs is formed on light receiving layer 4. In this step (S40), diffusion concentration distribution adjustment layer 5 is grown by the total organic MOVPE method.

Next, contact layer 6 is grown (step (S50)). Specifically, contact layer 6 made of InAs is formed on diffusion concentration distribution adjustment layer 5. In this step (S40), contact layer 6 is grown by the total organic MOVPE method.

Next, n type diffusion region 7 is formed (step (S60)). Specifically, Te serving as an n type impurity is selectively diffused into third main surface 6A of contact layer 6, via a diffusion mask (not shown). The diffusion mask is, for example, a silicon nitride (SiN) film, and has an opening over a region where n type diffusion region 7 is to be formed in third main surface 6A (from a different viewpoint, a region where a pixel P is to be arranged). Thereby, a plurality of n type diffusion regions 7 are formed in semiconductor layer laminate 2, at a predetermined interval. Each n type diffusion region 7 is formed such that the lower end of n type diffusion region 7 (i.e., Te diffusion front) reaches diffusion concentration distribution adjustment layer 5 but does not reach light receiving layer 4, and a pn junction is formed in diffusion concentration distribution adjustment layer 5. In this manner, a semiconductor substrate 10 including base substrate 1 and semiconductor layer laminate 2 is formed.

Next, the p type electrode and n type electrode 11 are formed (step (S70)). Specifically, the p type electrode is formed on second main surface 1B of base substrate 1. In addition, n type electrode 11 is formed on third main surface 6A of contact layer 6, on n type diffusion region 7. Each electrode can be formed by any film deposition method (for example, photolithography and vacuum evaporation, or sputtering film deposition). The p type electrode is in ohmic contact with base substrate 1, and n type electrode 11 is in ohmic contact with n type diffusion region 7 in contact layer 6. Next, passivation film 12 is formed to cover a region on third main surface 6A in which n type electrode 11 is not formed. Here, passivation film 12 may be formed without removing the diffusion mask, to avoid extra surface contamination. Thus, semiconductor device 100 serving as a light receiving device in accordance with the present embodiment can be obtained.

Figure 4:
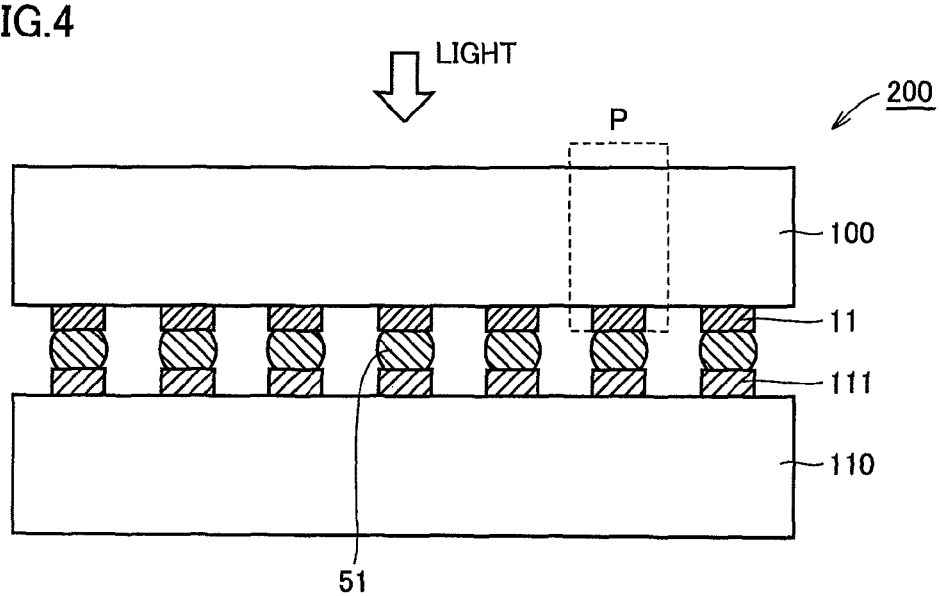
FIG. 4 is a cross sectional view of an optical sensor apparatus in which the semiconductor device in accordance with the present embodiment is combined with a read-out circuit.

Next, an optical sensor apparatus 200 including semiconductor device 100 in accordance with the present embodiment will be described with reference to FIG. 4. Optical sensor apparatus 200 is composed by joining semiconductor device 100 and a CMOS (Complementary Metal Oxide Semiconductor) 110 serving as a read-out circuit (Read-Out Integrated Circuit: ROIC). Specifically, n type electrode 11 of semiconductor device 100 is electrically connected with a read-out electrode 111 of CMOS 110, via a bump 51. In optical sensor apparatus 200, semiconductor device 100 constitutes one pixel P. Optical sensor apparatus 200 in accordance with the present embodiment operates, for example, as described below. A depletion layer extending from pn junction 15 is formed within light receiving layer 4, by applying a reverse bias to the p type electrode and n type electrode 11 of semiconductor device 100. When light having energy higher than the bandgap energy of light receiving layer 4 is incident on light receiving layer 4 from the base substrate 1 side, electron-hole pairs are generated, and holes drift to the p type electrode, whereas electrons drift to n type electrode 11. The electrons that have reached n type electrode 11 are read out by CMOS 110 via read-out electrode 111, and light intensity is determined in accordance with a charge amount thereof. Thereby, an image can be obtained.

Next, the function and effect of semiconductor device 100 in accordance with the present embodiment will be described.

Semiconductor device 100 in accordance with the present embodiment includes light receiving layer 4 having a type II quantum well structure composed of GaSb layer 4a, InAs layer 4b, and InSb layer 4c, and light receiving layer 4 is formed by the total organic MOVPE method. Thus, light receiving layer 4 has a high crystallinity and less crystal defects. As a result, in semiconductor device 100 in accordance with the present embodiment, the generation current generated within light receiving layer 4 via crystal defects can be reduced. In addition, in semiconductor device 100 in accordance with the present embodiment, since the film thicknesses of GaSb layer 4a, InAs layer 4b, and InSb layer 4c constituting light receiving layer 4 are controlled accurately by the total organic MOVPE method, light receiving layer 4 can have a predetermined cutoff wavelength.

Thereby, in semiconductor device 100 in accordance with the present embodiment, a dark current density of less than or equal to $1 \times 10^{-4}$ A/cm$^2$ can be achieved when a reverse bias voltage of 60 mV is applied to the p type electrode and n type electrode 11 with the temperature of semiconductor device 100 being set to −140° C., while setting the cutoff wavelength of light receiving layer 4 to approximately 5 μm. Further, in semiconductor device 100 in accordance with the present embodiment, a dark current density of less than or equal to $1 \times 10^{-8}$ A/cm$^2$ can be achieved when a reverse bias voltage of 60 mV is applied at a temperature of −196° C.

Furthermore, in light receiving layer 4, the film thickness of InSb (lattice constant: 0.646 nm) layer 4c is controlled to approximately more than or equal to 0.4 ML and less than or equal to 2 ML. This can prevent relaxation of a strain caused due to a difference in lattice constant between light receiving layer 4 including GaSb (lattice constant: 0.609 nm) layer 4a and InAs (lattice constant: 0.606 nm) layer 4b and base substrate 1 or buffer layer 3 made of GaSb. As a result, introduction of crystal defects such as dislocation into GaSb layer 4a and InAs layer 4b can be effectively suppressed.

Although the cutoff wavelength of light receiving layer 4 is set to approximately 5 μm in the present embodiment, the cutoff wavelength of light receiving layer 4 is not limited thereto. For example, when light receiving layer 4 has a multiple quantum well structure, the cutoff wavelength of light receiving layer 4 can be set to a predetermined value by controlling the combination, film thicknesses, composition, and the like of semiconductor layers. For example, the cutoff wavelength of light receiving layer 4 can be set to approximately 3 μm by setting the film thickness of GaSb layer 4a to 2 nm and setting the film thickness of InAs layer 4b to 2 nm. Also in this case, light receiving layer 4 has less crystal defects, and thus the generation current can be suppressed. Accordingly, a dark current density of less than or equal to $5 \times 10^{-5}$ A/cm$^2$ can be achieved when a reverse bias voltage of 60 mV is applied at a temperature of −140° C., and a dark current density of less than or equal to $1 \times 10^{-8}$ A/cm$^2$ can be achieved when a reverse bias voltage of 60 mV is applied at a temperature of −196° C.

In addition, for example, the cutoff wavelength of light receiving layer 4 can be set to approximately 8 μm by setting the film thickness of GaSb layer 4a to 4 nm and setting the film thickness of InAs layer 4b to 4 nm. Also in this case, light receiving layer 4 has less crystal defects, and thus the generation current can be suppressed. Accordingly, a dark current density of less than or equal to $1 \times 10^{-1}$ A/cm$^2$ can be achieved when a reverse bias voltage of 60 mV is applied at a temperature of −140° C., and a dark current density of less than or equal to $1 \times 10^{-5}$ A/cm$^2$ can be achieved when a reverse bias voltage of 60 mV is applied at a temperature of −196° C.

Further, although light receiving layer 4 is formed by the total organic MOVPE method in the present embodiment, light receiving layer 4 may be formed, for example, by the ordinary metal-organic vapor phase epitaxy method containing a hydride in a source material, or by the MBE method, although growth conditions leading to higher quality are limited. Also in this case, crystal defects in light receiving layer 4 can be reduced, and thus the generation current can be suppressed and the dark current can be reduced.

Furthermore, although semiconductor device 100 is composed as a planar-type light receiving device in the present embodiment, semiconductor device 100 is not limited thereto. Semiconductor device 100 may be composed, for example, as a mesa-type light receiving device by performing device separation using dry etching or wet etching. When semiconductor device 100 is composed as a mesa-type light receiving device, an n type layer (for example, InAs) may be formed, for example, by diffusing Te as in a planar-type light receiving device, or by doping an impurity such as Te or Si during growth.

Although the embodiment of the present invention has been described, it should be understood that the embodiment disclosed herein is illustrative and non-restrictive in every respect. The scope of the present invention is defined by the scope of the claims, and is intended to include any modifications within the scope and meaning equivalent to the scope of the claims.

What is claimed is:

1. A semiconductor device comprising a semiconductor layer laminate in which a plurality of semiconductor layers are laminated,
   said semiconductor layer laminate including a light receiving layer,
   said light receiving layer being grown by a metal-organic vapor phase epitaxy method,
   said light receiving layer having a cutoff wavelength of more than or equal to 3 μm and less than or equal to 8 μm,
   the semiconductor device having a dark current density of less than or equal to $1 \times 10^{-1}$ A/cm$^2$ when a reverse bias voltage of 60 mV is applied at a temperature of −140° C.,
   wherein said light receiving layer has a carbon concentration of less than or equal $1 \times 10^{16}$ cm$^{-3}$.

2. The semiconductor device according to claim 1, wherein said light receiving layer has a multiple quantum well structure.

3. The semiconductor device according to claim 2, wherein
   said light receiving layer has a type II multiple quantum well structure, and
   one period of said multiplex quantum well structure includes at least gallium antimonide and indium arsenide.

4. A semiconductor device comprising a semiconductor layer laminate in which a plurality of semiconductor layers are laminated,
   said semiconductor layer laminate including a light receiving layer,
   said light receiving layer having a cutoff wavelength of more than or equal to 3 μm and less than or equal to 8 μm,
   the semiconductor device having a dark current density of less than or equal to $1 \times 10^{-4}$ A/cm$^2$ when a reverse bias voltage of 60 mV is applied at a temperature of −140° C.,
   wherein said light receiving layer has a carbon concentration of less than or equal to $1 \times 10^{16}$ cm$^{-3}$.

5. The semiconductor device according to claim 4, wherein
   said light receiving layer has a cutoff wavelength of more than or equal to 3 μm and less than or equal to 5 μm, and
   the semiconductor device has a dark current density of less than or equal to $5 \times 10^{-5}$ A/cm$^2$ when a reverse bias voltage of 60 mV is applied at a temperature of −140° C.

6. The semiconductor device according to claim 4, wherein said light receiving layer has a cutoff wavelength of more than or equal to 3 µm and less than or equal to 6 µm, and the semiconductor device has a dark current density of less than or equal to $1\times10^{-8}$ A/cm$^2$ when a reverse bias voltage of 60 mV is applied at a temperature of −196° C.

7. The semiconductor device according to claim 4, wherein said light receiving layer has a cutoff wavelength of more than or equal to 6 µM and less than or equal to 8 µm, and the semiconductor device has a dark current density of less than or equal to $1\times10^{-5}$ A/cm$^2$ when a reverse bias voltage of 60 mV is applied at a temperature of −196° C.

8. The semiconductor device according to claim 4, wherein said light receiving layer has a multiple quantum well structure.

9. The semiconductor device according to claim 8, wherein said light receiving layer has a type II multiple quantum well structure, and one period of said multiplex quantum well structure includes at least gallium antimonide and indium arsenide.

10. The semiconductor device according to claim 4, wherein said light receiving layer is grown by a metal-organic vapor phase epitaxy method.

* * * * *